(12) United States Patent
Ito

(10) Patent No.: US 7,627,445 B2
(45) Date of Patent: Dec. 1, 2009

(54) APPARATUS FOR TESTING A DEVICE WITH A HIGH FREQUENCY SIGNAL

(75) Inventor: Yoshimasa Ito, Tokyo (JP)

(73) Assignee: Advantest Corporation, Ora-Gun (JP)

( * ) Notice: Subject to any disclaimer, the term of this patent is extended or adjusted under 35 U.S.C. 154(b) by 0 days.

(21) Appl. No.: 10/993,750

(22) Filed: Nov. 19, 2004

(65) Prior Publication Data
US 2005/0171718 A1 Aug. 4, 2005

Related U.S. Application Data

(60) Provisional application No. 60/525,786, filed on Nov. 26, 2003.

(51) Int. Cl.
*G01R 31/00* (2006.01)

(52) U.S. Cl. ...................... 702/117; 324/754

(58) Field of Classification Search ................ 702/57
See application file for complete search history.

(56) References Cited

U.S. PATENT DOCUMENTS

| | | | |
|---|---|---|---|
| 4,045,735 A * | 8/1977 | Worcester et al. | 324/537 |
| 4,707,834 A | 11/1987 | Frisch et al. | |
| 4,731,577 A | 3/1988 | Logan et al. | |
| 5,014,002 A | 5/1991 | Wiscombe et al. | |
| 5,116,244 A | 5/1992 | Cartier et al. | |
| 5,477,159 A * | 12/1995 | Hamling | 324/754 |
| 5,558,541 A * | 9/1996 | Botka et al. | 439/675 |
| 5,846,097 A * | 12/1998 | Marian, Jr. | 439/289 |
| 5,903,143 A | 5/1999 | Mochizuki et al. | |
| 5,944,548 A | 8/1999 | Saito | 439/248 |
| 5,969,535 A | 10/1999 | Saito | 324/758 |
| 6,028,439 A | 2/2000 | Arkin et al. | |
| 6,313,653 B1 | 11/2001 | Takahashi et al. | |
| 6,791,317 B1 * | 9/2004 | Walsh et al. | 324/158.1 |
| 2001/0025957 A1 | 10/2001 | Takahashi | |

FOREIGN PATENT DOCUMENTS

DE 3524035 1/1987
DE 3524035 A * 1/1987

(Continued)

OTHER PUBLICATIONS

Patent Abstracts of Japan, vol. 2000, No. 11, Jan. 3, 2001 and JP 2000-235061 A, published Aug. 29, 2000.
Patent Abstracts of Japan, vol. 2000, No. 5, Sep. 14, 2000 and JP 2000-048920, published Feb. 18, 2000.
Patent abstract of esp@cenet database, German Patent No. DE-3524035 dated Jan. 8, 1987, Applicant: Standard Electrik Lorenz AG.

*Primary Examiner*—Manuel L Barbee
(74) *Attorney, Agent, or Firm*—Morrison & Foerster LLP

(57) ABSTRACT

The present invention provides an apparatus for testing a device with a high frequency signal, such as an RF signal. The apparatus delivers a high frequency signal directly to a loadboard with a coaxial cable. The coaxial cable can deliver the signal to a location at or near the device on the loadboard. The cable can connect to the loadboard through a threaded connection. The other end of the cable can connect to a testing module or another cable. The apparatus can further comprise a section or housing between the circuit board and the testing module to provide support for the cables and their respective connections. The apparatus can further provide connections for both high frequency testing and low frequency testing.

21 Claims, 2 Drawing Sheets

FOREIGN PATENT DOCUMENTS

| | | |
|---|---|---|
| EP | 0 147 135 A | 7/1985 |
| GB | 2 195 029 A | 3/1988 |
| JP | 2000-048920 | 2/2000 |
| JP | 2000-235061 | 8/2000 |

\* cited by examiner

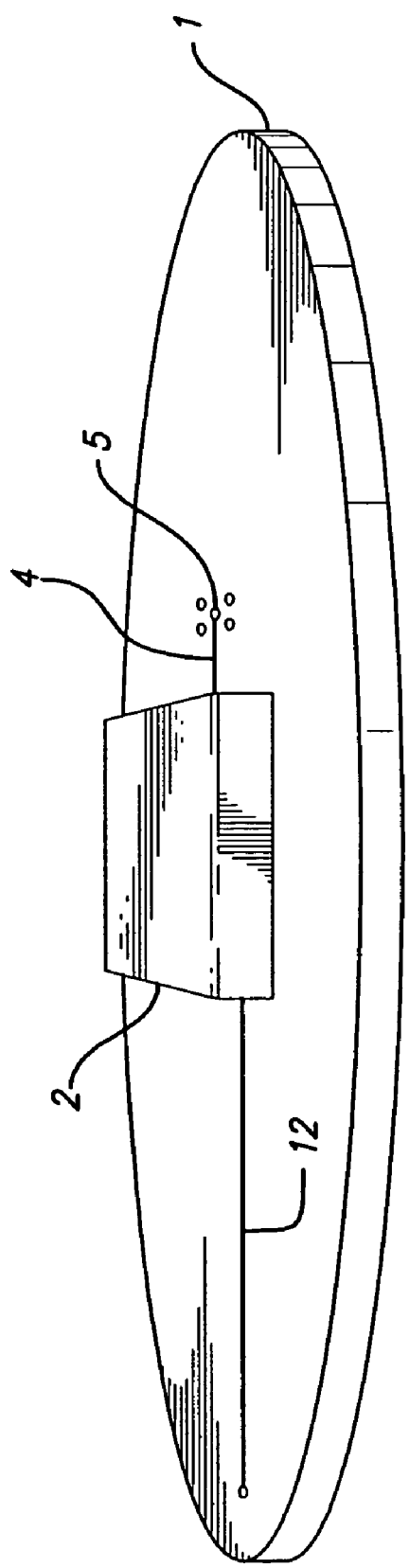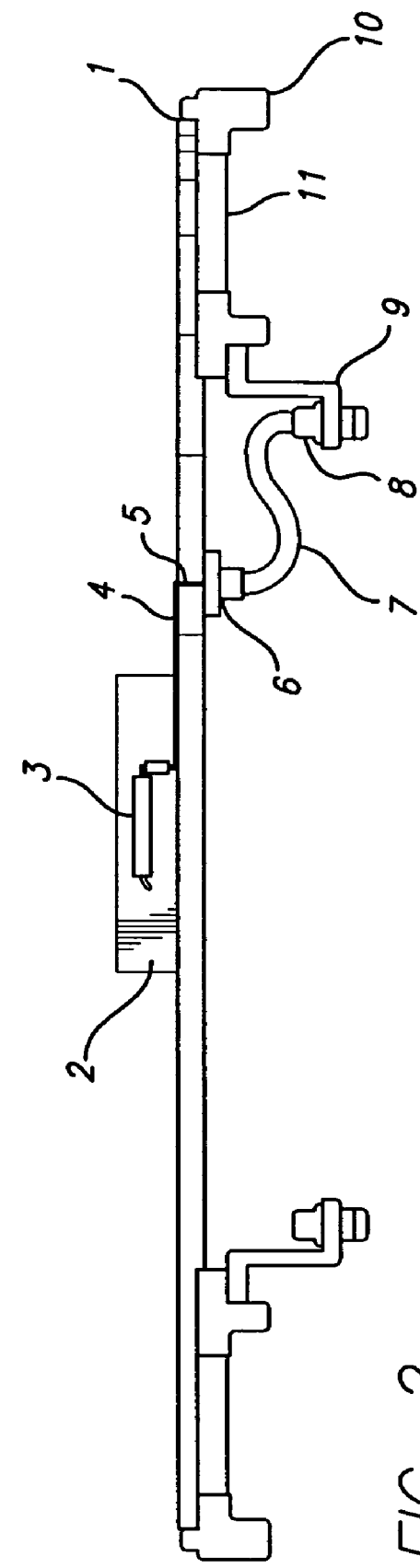
FIG. 1
FIG. 2

APPARATUS FOR TESTING A DEVICE WITH A HIGH FREQUENCY SIGNAL

CROSS-REFERENCE TO RELATED APPLICATIONS

This application claims priority to U.S. provisional application Ser. No. 60/525,786 entitled "Test Head Modules for RF and Mixed-Signal/Analog Testing," filed Nov. 26, 2003, and is related to U.S. non-provisional application Ser. No. 10/779,031 entitled "Synchronization of Modules for Analog and Mixed Signal Testing in an Open Architecture Test System," filed Feb. 13, 2004, with the contents of each incorporated herein by reference for all purposes.

BACKGROUND OF THE INVENTION

The present invention relates to an apparatus for testing a device with a high frequency signal and, more particularly, to an apparatus for testing a device by delivering a high frequency signal with a coaxial cable at or near the device.

Automatic test equipment systems or ATE systems are used to test devices such as semiconductor devices. An ATE system typically comprises a tester that generates test signals which are transmitted to a test head. The test head houses a plurality of modules. The test signals are transmitted from the modules to contact pins or pogo pins. The pins are arranged to contact the periphery of a circuit board or loadboard. Traces in the loadboard deliver the test signals from the periphery of the loadboard to a socket at the center of the loadboard. A device under test or DUT is inserted into the socket to establish electrical contact for testing. Thus, the test signals are transmitted from the tester to the DUT through the modules, contact pins, loadboard and socket. The resulting signals from the DUT are received by the tester for evaluation through the same elements.

The semiconductor devices are typically tested with low frequency signals. With the development of new types of semiconductor devices along with new testing protocols, it is currently preferable to test a DUT with a higher frequency signal.

The use of higher frequency signals has revealed certain disadvantages with the conventional ATE system. In the conventional ATE system, the loadboard can be very large and traces from the periphery of the loadboard to its center can reach 12 inches in length or even longer. Such long traces present certain problems with higher frequency test signals. First, parasitic loss in the trace is proportional to the frequency of the test signal in the trace. A high frequency signal at one of end of the a long trace can be lost by the time the signal reaches the other end of the trace. Second, even if the signal is not completely lost, the parasitic loss can create a phase difference in the signal that is not desirable. Third, the close proximity of long traces with high frequency signals can result in milli-volt fluctuations due to arc potential. Such fluctuations can destroy the high frequency signal.

BRIEF SUMMARY OF THE INVENTION

The present invention provides an apparatus for testing a device with a high frequency signal that overcomes the above limitations of conventional ATE systems. The apparatus of the present invention delivers a high frequency signal directly to a loadboard with a coaxial cable. The coaxial cable allows the signal to be delivered to a location at or near the device on the loadboard. This reduces the length of the trace to the device. Furthermore, there is almost no electrical loss associated with a coaxial cable. The coaxial cable also has shielding which works to avoid milli-volt fluctuations by acting as a stable ground.

In one embodiment of the present invention, the apparatus comprises a socket wherein a device is inserted, a circuit board upon which the socket is mounted and a testing module for transmitting a test signal. At least one coaxial cable is used to transmit the test signal to the circuit board for testing the device. A first end of the cable communicates with the testing module while the second end of the cable is in contact with the circuit board at a location. The location can be anywhere on the circuit board. If the test signal is a high frequency signal, such as a radio frequency (RF) signal, the location can be at or near the socket or at or near the device to reduce the length of the trace from the location to the device.

The coaxial cable can be any type, such as semi-rigid coaxial cable. The cable can further have a SMA connector at its second end for threaded mating with the circuit board. In this manner, the cable can be directly connected to the circuit board at the desired location. Through the threaded connection, the test signal can be delivered directly to a trace or, alternatively, to a via in the circuit board that in turn is connected to a trace.

The first end of the coaxial cable communicates with the testing module. In one embodiment, the first end communicates with the testing module by being directly connected to a given module. In another embodiment, the first end communicates with the testing module through a second coaxial cable. The second coaxial cable is used between the first end of the first coaxial cable and the testing module to allow communication therebetween. Using two coaxial cables avoids the need for a single lengthy coaxial cable in a large testing apparatus. A lengthy coaxial cable may sag, may become entangled with other wiring in the apparatus and may take up valuable space in the apparatus. The second coaxial cable can also be a semi-rigid coaxial cable. It can connect to the first coaxial cable through a threaded connection or push-on connection, such as a blind-mate connection. The second coaxial cable can also be directly connected to the testing module through a threaded connection or a push-on connection.

The apparatus can further comprise a section or housing between the circuit board and the testing module. The section or housing can comprise a plate that supports the circuit board for the threaded connection. Moreover, the plate can have an extension that supports the first coaxial cable. The extension prevents the cable from becoming undone at its connections in the event the testing apparatus is moved. Furthermore, in the embodiment with two coaxial cables, the extension can be used to facilitate the connection between the two cables. The section or housing can further comprise an alignment plate having a second extension to further support the connection between the coaxial cables.

In another embodiment of the present invention, the apparatus comprises a socket wherein a device is inserted, a circuit board upon which the socket is mounted and at least two testing modules for transmitting test signals. Each module can be a sub-instrument designed to be interconnected to form a complete testing apparatus. The first testing module can transmit a low frequency signal, while the second testing module can transmit a high frequency signal. For example, the apparatus can perform RF and mixed-signal/analog testing.

A plurality of coaxial cables transmit test signals at or near the device from the testing modules. The coaxial cables can communicate exclusively with the second testing module that transmits the high frequency signal. The coaxial cables can also communicate with the first testing module to deliver the low frequency signal to the circuit board. Coaxial cables can be used for such a low frequency signal given their many benefits such as acting as a stable ground.

These and other features and advantages of embodiments of the present invention will be apparent to those skilled in the art from the following detailed description of the embodiments of the invention, when read with the drawings and the appended claims.

BRIEF DESCRIPTION OF THE DRAWINGS

FIG. 1 is a schematic illustration of a circuit board embodying the present invention.

FIG. 2 is a schematic partial side illustration of a circuit board embodying the present invention with additional detail relating to a coaxial cable connection and support.

DETAILED DESCRIPTION OF THE INVENTION

Figure 3:
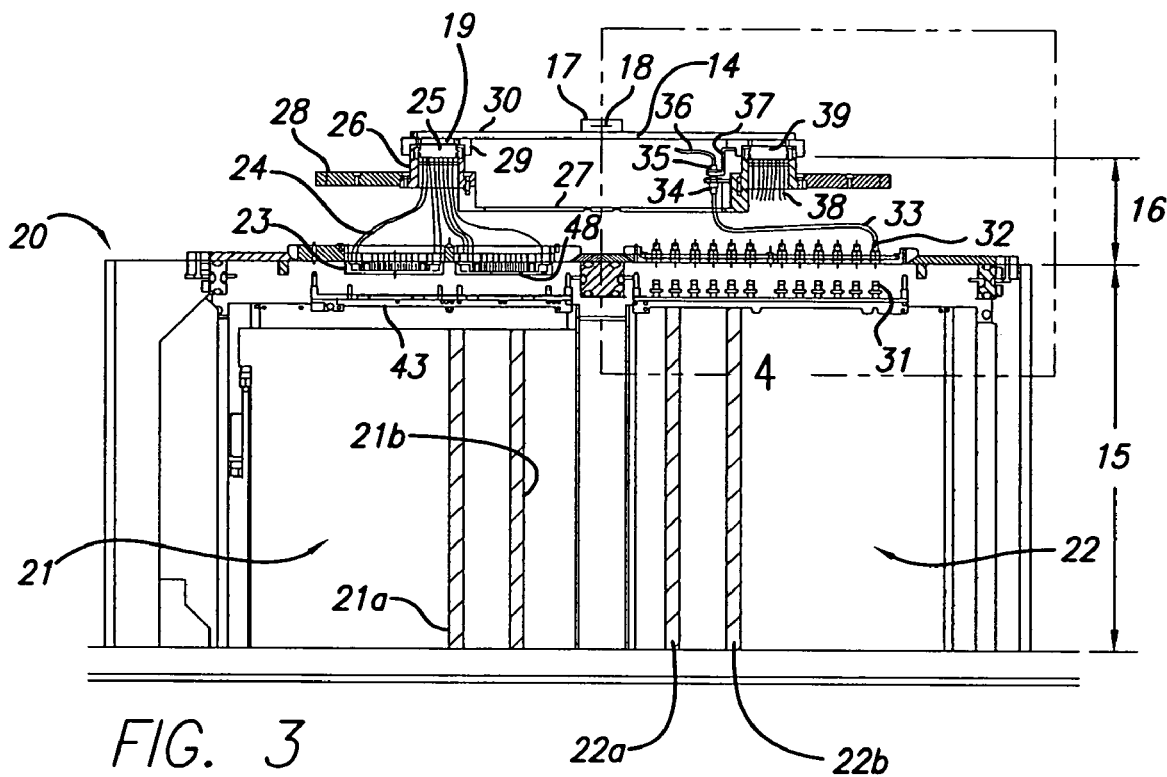
FIG. 3 is a partial exploded side view of a testing apparatus embodying the present invention.

In the following description of embodiments, reference is made to accompanying drawings which form a part hereof and in which is shown by way of illustration specific embodiments in which the invention may be practiced. It is to be understood that other embodiments may be utilized and structural changes may be made without departing from the scope of the preferred embodiments of the present invention.

FIG. 1 shows a schematic illustration of a circuit board embodying the present invention while FIG. 2 shows a schematic partial side illustration of a circuit board embodying the present invention with additional detail relating to a coaxial cable connection and support. The following discussion references both FIG. 1 and FIG. 2 and like reference numerals refer to the same element.

Circuit board 1 is a printed circuit board having an circular shape. Circuit board 1 can be any other shape, such as elliptical, rectangular or square. On circuit board 1, a socket 2 is mounted. Socket 2 houses a device 3 for testing. FIG. 2 illustrates device 3 inserted in socket 2. Devices to be tested include, but are not limited to, W-LAN, cell phone, audio, video, disk drive, HDTV, DVD, and other RF, analog, and mixed-signal integrated circuits.

Device 3 is electrically connected to traces 4 and 12 through socket 2. FIGS. 1 and 2 both illustrate trace 4 on the first layer of the circuit board 1, but trace 4 can be at any layer or layers of circuit board 1. Any type of trace can be used, such as a micro strip line. Trace 12 extends to the periphery of the circuit board 1. Although FIG. 1 illustrates trace 12 on the same layer as trace 4, it can be at a different layer than trace 4. Furthermore, trace 12 can any type of trace and does not have to be the same type of trace as trace 4.

Trace 4 terminates at its other end at connection 5. Connection 5 is a connection for a cable 7. The connection be any type such as, without limitation, a fitting for the cable, a nut to receive the end of the cable or even a hole. FIG. 1 illustrates connection 5 as vertical member running through the circuit board 1, but the connection 5 can be any shape and located anywhere on the board such as only on the lower surface of circuit board 1. The connection 5 is adjacent to the socket 2 and device 3. The connection 5 can positioned to be closer such as being directly at socket 2 or even device 3. FIG. 1 illustrates other connections near connection 5 for other cables. Trace 12 may terminate in the same manner as trace 4 or in a different manner.

Cable 7 can be any type of cable that transmits an electrical signal. In FIG. 2, cable 7 is a coaxial cable, such as (but not limited to) a semi-rigid coaxial cable. Coaxial cable 7 has at its end a connector 6 to mate with connection 5. Connector 6 can be a plug, or it can be a jack. The mating can be a threaded connection, in which connector 6 is a SMA connector having threads that mate with connection 5. For example, connection 5 can comprise a coupling nut that mates with connector 6 to provide for an SMA connection. Connector 6 can be hand-tightened or torqued with a wrench to achieve the threaded mating. Connector 6 in FIG. 1 is shown to connect with the bottom surface of circuit board 1. However, the connection can be many anywhere on the circuit board 1, such as its top surface.

Upon mating, connector 6 directly contacts the trace 4 to transmit a test signal from a testing module (not illustrated) through coaxial cable 7. Although connector 6 and trace 4 are in direct contact as illustrated in FIG. 2, it is not necessary for connector 6 to directly contact trace 4 to transmit the test signal. Connector 6 can mate with circuit board 1 at a via. The via delivers the test signal through the circuit board to trace 4 on the first layer of the circuit board.

Although FIG. 2 illustrates a connection at circuit board 1 with at least one SMA connector, the present invention is not limited to SMA connectors or even threaded mating. Other types of mating that can be used include bayonet mating in which the connectors engage with a push to insert the studs of the jack inside the plug coupling nut and then the coupling nut is rotated to seat the studs. Another type of mating is push-on mating in which the connectors mate with a straight push and unmate with a straight pull. Push-on mating includes: positive locking connectors that have a spring-loaded collar on the coupling nut; snap-on connectors which utilize spring fingers in the plug to snap into a groove in the jack; and slide-on connectors, such as blind-mate connectors, that mate by spring-finger friction. Slide-on connectors are particularly useful when mating and unmating must occur frequently.

The other end of cable 7 has a connector 8 as illustrated in FIG. 2. Connector 8 can directly connect to a testing module (not illustrated in FIG. 2) or any assembly connected to the testing module. Connector 8 can also communicate with the testing module through an additional cable as described herein. Connector 8 can be a blind-mate connector, particularly if it will be frequently unmated to be connected to different testing modules, or it can also be designed for a threaded connection with the testing module, such as a SMA connector.

FIG. 2 further illustrates a support between circuit board 1 and the testing module (not shown) in FIG. 2. The support comprises a plate 10 that provides support for circuit board 1 including support for the connection with cable 7. The plate 10 can be a stiffener made of a stiff material to prevent circuit board 1 from breaking during testing and maintenance, given that circuit board 1 can be less than 5 millimeters thick. Furthermore, support may be necessary if different devices are tested using the present embodiment. Different devices will likely require different testing protocols, thereby requiring frequent mating and unmating of the connections to circuit board 1. A support can prevent the circuit board 1 from breaking each time connection is done or undone.

Plate 10 can have an extension 9 that supports cable 7 at its connector 8. Extension 9 prevents the cable from becoming undone at its connection in the event the testing apparatus is moved. In the embodiment in which a second cable is connected to cable 7, extension 9 can be used to further facilitate the connection between the two cables. It can be used to keep connector 8 in place to allow for easy mating and unmating.

Extension 9 can be made of any suitable material providing the necessary stiffness, durability and affordability. Moreover, while extension 9 is illustrated in FIG. 2 as having an "S" shape, other shapes or arrangments can be used.

Circuit board 1 is not limited to receiving signals from a cable and transmitting signals to the cable 7. The circuit board 1 can also receive and transmit signals through contact pins or pogo pins. Reference numeral 11 in FIG. 2 illustrates an assembly for a connector plug housing for the circuit board (not shown in FIG. 2). The connector plug housing for the circuit board connects a plurality of coaxial cables from the testing modules to the circuit board. The pins contact traces on the circuit board such as trace 12. Thus, the circuit board 1 can receive signals from cable 7 and through the assembly 11 from the connector plug housing. It should be noted that the traces can be shortened by having the assembly 11 and the corresponding pins contact circuit board 1 closer to the device 3. This arrangement provides the benefits of a shorter trace as discussed above.

Whether the signals are transmitted through cable 7 or assembly 11, they can be at any frequency. High frequency signals include, but are not limited to, RF signals. RF signals can be, for example, in the mega-Hertz and giga-Hertz range. It may be preferable to deliver high frequency signals through cable 7 while delivering low frequency signals through assembly 11. Of course, any other arrangement can be employed such as delivering low frequency signals through cable 7.

Figure 4:
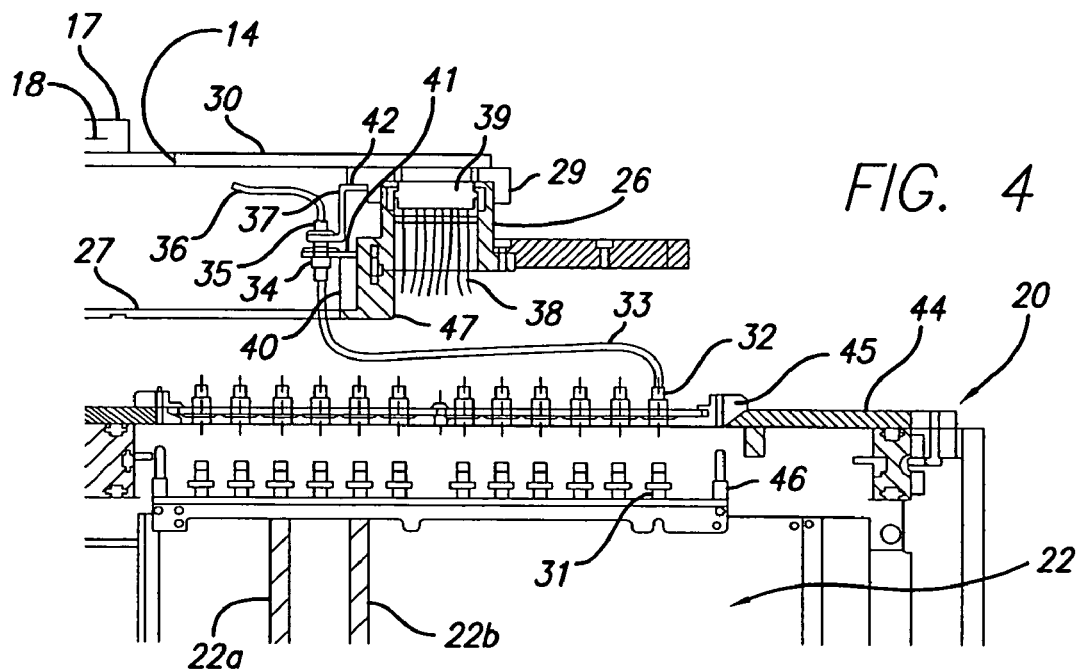
FIG. 4 is a detailed view of area 4 of FIG. 3.

FIG. 3 illustrates a partial, exploded side view of a testing apparatus 20. FIG. 4 provides an enlarged view of area 4 in FIG. 3. The following discussion references both FIG. 3 and FIG. 4.

Testing apparatus 20 comprises testhead 15 that holds testing modules and a hifix 16. Hifix 16 can be viewed as a section of the testing apparatus 20 or a housing that allows the testing modules to be connected to the performance board or circuit board 30 which rests on hifix 16. The hifix 16/circuit board 30 interface is shown at the interface between the plug housing 39 and stiffener 29, but the interface can be between stiffener 29 and the circuit board 30. On circuit board 30, a socket 17 is mounted in which a device 18 is inserted for testing.

The testhead 15 includes a group of modules designed to perform RF and mixed-signal/analog testing on a variety of devices, including device 18. In section 21 of test head 15, there are one or more digital/analog modules, such as 21a and 21b, that test device 18 using digital or analog signals. In section 22 of test head 15, there are one or more RF modules, such as 22a and 22b, that test device 18 using RF signals.

The digital/analog modules, such as 21a and 21b, connect to circuit board 30 in the following manner. A connector 48, such as a 120 pin connector, at the top of the digital/analog modules is housed in a connector plug housing or assembly 23. The signals from the modules, such as 21a and 21b, are cabled up through hifix 16 using cables 24. FIG. 3 illustrates only an exemplary number of cables. Cables 24 can be coaxial cables. Cables 24 are in turn connected to a connector plug housing or assembly 25. Plug housing 25, in turn, is connected to circuit board 30 through assembly 19 at the periphery of the circuit board 30. Traces (not illustrated) deliver the signals to socket 17 which houses the device 18.

Hifix 16 is located between circuit board 30 and testing modules, such as 21a, 21b, 22a and 22b. Hifix 16 is a section of the testing apparatus 20 that provides support for many elements in hifix 16 and/or at the interfaces with testhead 15 and circuit board 30. The hifix section can comprise an alignment plate 26. The alignment plate 26 in FIGS. 3 and 4 is an annular inverted T-shaped member. The inner section between the ends of the "T" receive plug housing 25 and cables 24. This allows the alignment plate 26 to provide support to the plug housing 25 as illustrated in FIG. 3. Such support includes aligning the plug housing 25 with the connector 19 such that the pins are correctly aligned with the traces on circuit board 30.

Connected to the alignment plate 26 is a floating unit 27. Floating unit 27 in FIG. 3 is a cylindrical unit. The vertical sides of the unit 27 are joined to the inner ring of the alignment plate 26. The floating unit 27 provides further structural support in hifix 16. By connecting to the inner side of the alignment pate 26, it supports the alignment plate and assists in the alignment of the alignment plate 26. The bottom of the floating unit 27 further provides support through its connection with test head 15.

Alignment plate 26 is also connected to top plate 28 on its outer side. Top plate 28 in FIG. 3 is an annular plate that can be any shape. Like floating unit 27, top plate 28 provides support to the alignment plate 26 and assists in the alignment of the alignment plate 26. It further provides an interface with the top surface or cover of testing apparatus 20. Within the inner opening of top plate 28, cables 24 are cabled up through the hifix 16.

It should be noted that FIG. 3 illustrates hifix 16 in an exploded view. Top plate 28 and floating unit 27 would in operation be resting on testhead 15. Similarly, connector 48 mates with assembly 43 at the hifix 16/testhead 15 interface, but is illustrated in FIG. 3 as separated from assembly 48. Moreover, testing modules 21a, 21b, 22a and 22b are not shown connected to cables directly or via an assembly.

At the hifix 16/circuit board 30 interface, a stiffener 29 supports circuit board 30. In this embodiment, the stiffener is annular plate. The plate comprises a smaller ring within a larger ring. Between the rings are four extensions that connect the rings together. An outer portion of circuit board 30 fits within the space between the smaller and larger ring. From hifix 16, the plug housing 25 through assembly 19 is received between the smaller and larger ring to establish electrical connection between testing modules and circuit board 30. Although FIG. 3 illustrates plug housing 25 at the periphery of circuit board 30, stiffener 29 can be any size, thereby allowing the plug housing to be near or at the device 18 while still providing support through the stiffener. The stiffener can further have holes or connections for connection to alignment plate 26. Testing apparatus 20 can thereby have a hifix 16 that is a section or housing that comprises alignment plate 26, floating unit 27, top plate 28 and stiffener 29.

In section 22 of testhead 15, RF modules such as 22a and 22b are connected to a series of cables, such as cable 33. FIGS. 3 and 4 only illustrate one cable 33, but the present invention can include a plurality of cables. The connection between cable 33 and an RF module is through two connectors 31 and 32. Each of the connectors is housed in or connected to its own assembly. Assembly 46 supports connector 31 and other such connectors in their connection to the RF modules, such as 22a and 22b. Assembly 45 supports connector 32 and other such connectors. Assembly 45 is connected to a plate 44 that is at the interface of the hifix 16 and testhead 15. FIG. 4 illustrates the assemblies 45 and 46 separated, but in operation the assemblies 45 and 46 join to allow connectors 31 and 32 to mate. Of course, connector 31 can directly mate with connector 32 without any such assemblies.

Connector 31 can be a receptacle connected to assembly 46. Furthermore, FIGS. 3 and 4 illustrate connector 31 as a plug, but it can be a jack. Similarly, FIGS. 3 and 4 illustrate connector 32 as a jack, but it can be a plug. The mating between connectors 31 and 32 can be any of the types of mating discussed herein, such as threaded or push-on. In one embodiment, connector 31 is a BMA or blind-mate plug connector and connector 32 is a BMA or blind-mate jack connector to form a blind-mate connection.

At the other end of cable 33 is connector 34. Connector 34 mates with connector 35 which is at one end of cable 36.

Connectors 34 and 35 can be any combination of plug and jack. Furthermore, the mating between connectors 34 and 35 can be any of the types of mating discussed herein, such as threaded or push-on. In one embodiment, connector 34 is a BMA or blind-mate plug connector and connector 35 is a BMA or blind-mate jack connector to form a blind-mate connection.

Cable 36 transmits signals to circuit board 30 through its other end, which is not illustrated in FIGS. 3 and 4. The other end connects at the device or socket or, as illustrated, adjacent to the device 18 and socket 17 at via 14. The mating connection between this end of cable 36 and the circuit board 30 can be any of the types discussed herein, such as threaded or push-on. In one embodiment, the connector of the cable is an SMA connector jack that directly contacts via 14. Via 14 delivers the test signal to socket 17 and device 18 via a trace on circuit board 30. In this manner, RF signals from test modules, such as 22a and 22b, can be transmitted and received through 33 and 36 and with a connection between connectors 31 and 32, between connectors 34 and 35 and at via 14. Because the connection is adjacent to the device 18, the length of the trace is considerably shorten, thereby avoiding the disadvantages of utilizing long traces. Furthermore, the use of coaxial cables 33 and 36 provides further benefits such as acting as a stable ground.

Although FIG. 3 has separated the RF and digital/analog modules into separate groups, such a division is not necessary. As illustrated in FIGS. 3 and 4, section 22 of testhead 15 includes cables 38. These cables can deliver low frequency test signals from modules in section 22 (the connection to the modules is not illustrated). The cables 38 connect to a plug housing 39 and, in turn, into an assembly, such as assembly 19, to establish electrical contact with circuit board 30.

The mating between connectors 34 and 35 can be unsupported or, as illustrated in FIGS. 3 and 4, can be supported. The support can be a series of brackets connected to various members in hifix 16. In one embodiment, an S-shaped bracket 42 is connected at one end of stiffener 29. At its other end, bracket 42 supports connector 35. Bracket 42 can be any shape and the present invention contemplates other types or arrangements for supporting connector 35, such as an annular member directly connected to alignment plate 29. Connector 34 can also be supported. In one embodiment, illustrated in FIGS. 3 and 4, connector 34 is supported by vertical member 40 having a horizontal bracket 41. Vertical member is positioned between the top surface of the floating unit 27 and its side section 47.

Although the present invention has been described with respect to testing integrated circuits, the concept of the present invention is also applicable to testing devices other than integrated circuits.

Although the present invention has been fully described in connection with the embodiments thereof and with reference to the accompanying drawings, it is to be noted that various changes and modifications will become apparent to those skilled in the art. Such changes and modifications are to be understood as being included within the scope of the present invention as defined by the claims.

What is claimed is:

1. An apparatus for testing a device comprising:
   a socket wherein the device is inserted;
   a circuit board upon which the socket is mounted, the circuit board comprising a trace connected to the socket and having a plate-like shape;
   a first testing module for transmitting a high frequency test signal;
   a second testing module for transmitting a low frequency test signal;
   a plate, disposed parallel to the plate-like shape of the circuit board, supporting the circuit board at a fringe region of the circuit board, said plate having an extension;
   a coaxial cable having a first end supported by the extension of the plate and having a second end connected to the circuit board at a location;
   a first connection path including the coaxial cable and extending from the first testing module to the socket; and
   a second connection path including the trace and extending from the second testing module to the socket, the second connection path being free of any coaxial cable
   wherein the high frequency test signal is a signal having a frequency higher than one megahertz.

2. The apparatus of claim 1 wherein the second end of the cable is in contact with the circuit board through an SMA connection.

3. The apparatus of claim 2 further comprising a second coaxial cable, said second coaxial cable having a first end connected to the first end of the cable and a second end connected to the first testing module.

4. The apparatus of claim 3 wherein the first end of the cable and the first end of the second cable are connected through a blind-mate connection.

5. The apparatus of claim 3 wherein the second end of the second cable and the first testing module are connected through a blind-mate connection.

6. The apparatus of claim 2 further comprising a housing between the circuit board and the first and second testing modules.

7. The apparatus of claim 6 wherein the housing comprises the plate.

8. The apparatus of claim 7 wherein the housing further comprises an alignment plate, said alignment plate having another extension supporting the first end of the second cable.

9. The apparatus of claim 1 wherein the location is at the device.

10. The apparatus of claim 9 wherein the circuit board has a trace from the socket to the location.

11. The apparatus of claim 1 wherein the high frequency test signal is a radio frequency signal.

12. The apparatus of claim 1 wherein the circuit board has a trace from the socket to the location.

13. The apparatus of claim 12 wherein the trace is a micro strip line.

14. The apparatus of claim 12 wherein the circuit has a via at the location for connecting the second end of the cable to the trace.

15. The apparatus of claim 1 wherein the cable is semi-rigid.

16. The apparatus of claim 1 wherein the device is a semiconductor device.

17. The apparatus of claim 1 wherein the location is adjacent to the device.

18. The apparatus of claim 17 wherein the circuit board has a trace from the socket to the location.

19. The apparatus of claim 18 wherein the trace is a micro strip line.

20. The apparatus of claim 18 wherein the circuit has a via at the location for connecting the second end of the cable to the trace.

21. The apparatus of claim 1 wherein the plate is made of a stiff material.

* * * * *